(12) United States Patent
Matsunaga et al.

(10) Patent No.: US 7,242,094 B2
(45) Date of Patent: Jul. 10, 2007

(54) SEMICONDUCTOR DEVICE HAVING CAPACITOR FORMED IN MULTILAYER WIRING STRUCTURE

(75) Inventors: Takeshi Matsunaga, Yokohama (JP); Yuichi Nakashima, Yokohama (JP); Koji Miyamoto, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/626,592

(22) Filed: Jul. 25, 2003

(65) Prior Publication Data

US 2004/0207043 A1 Oct. 21, 2004

(30) Foreign Application Priority Data

Jul. 26, 2002 (JP) ............................. 2002-218399

(51) Int. Cl.
H01L 29/76 (2006.01)
H01L 29/94 (2006.01)
H01L 31/062 (2006.01)
H01L 31/113 (2006.01)
H01L 31/119 (2006.01)

(52) U.S. Cl. ...................... 257/758; 257/306; 257/774; 257/27.048; 257/27.088

(58) Field of Classification Search .......... 257/532–35, 257/758, 760, 300, 303, 306, 774; 438/637–40, 438/957, 244, 253, 387; 361/303, 306.1, 361/306.3
See application file for complete search history.

(56) References Cited

U.S. PATENT DOCUMENTS

| | | | | |
|---|---|---|---|---|
| 5,986,299 A * | 11/1999 | Nakamura et al. | .......... | 257/296 |
| 6,130,449 A * | 10/2000 | Matsuoka et al. | .......... | 257/296 |
| 6,294,834 B1 * | 9/2001 | Yeh et al. | ................... | 257/758 |
| 6,313,003 B1 * | 11/2001 | Chen | .......................... | 438/396 |
| 6,316,801 B1 * | 11/2001 | Amanuma | .................. | 257/306 |
| 6,342,734 B1 * | 1/2002 | Allman et al. | .............. | 257/758 |
| 6,417,092 B1 * | 7/2002 | Jain et al. | .................... | 438/624 |
| 6,504,202 B1 * | 1/2003 | Allman et al. | .............. | 257/303 |
| 6,534,809 B2 * | 3/2003 | Moise et al. | ................. | 257/295 |

(Continued)

FOREIGN PATENT DOCUMENTS

CN 1315745 A 10/2001

(Continued)

OTHER PUBLICATIONS

U.S. Appl. No. 10/626,592, filed Jul. 25, 2003, Matsunaga et al.

(Continued)

Primary Examiner—Jerome Jackson
Assistant Examiner—Jesse Fenty
(74) Attorney, Agent, or Firm—Oblon, Spivak, McClelland, Maier & Neustadt, P.C.

(57) ABSTRACT

A semiconductor device having a capacitor formed in a multilayer wiring structure, the semiconductor device comprising a multilayer wiring structure including a plurality of wiring layers formed on a substrate, a capacitor arranged in a predetermined wiring layer in the multilayer wiring structure and having a lower electrode, a dielectric film, and an upper electrode, a first via formed in the predetermined wiring layer and connected to a top surface of the upper electrode of the capacitor, and a second via formed in an overlying wiring layer stacked on the predetermined wiring layer, the second via being formed on the first via.

8 Claims, 4 Drawing Sheets

U.S. PATENT DOCUMENTS

| | | | |
|---|---|---|---|
| 6,603,203 B2 * | 8/2003 | Amanuma | 257/758 |
| 6,639,263 B2 * | 10/2003 | Kumagai et al. | 257/296 |
| 6,657,247 B2 * | 12/2003 | Yoshiyama et al. | 257/303 |
| 6,734,477 B2 * | 5/2004 | Moise et al. | 257/295 |
| 6,740,974 B2 * | 5/2004 | Yoshitomi | 257/751 |
| 6,794,694 B2 * | 9/2004 | Diodato et al. | 257/295 |
| 6,916,722 B2 * | 7/2005 | Huang et al. | 438/396 |
| 2001/0025973 A1 * | 10/2001 | Yamada et al. | 257/296 |
| 2002/0153554 A1 * | 10/2002 | Kajita et al. | 257/306 |
| 2003/0173669 A1 * | 9/2003 | Shau | 257/758 |
| 2004/0197991 A1 * | 10/2004 | Lee et al. | 438/253 |

FOREIGN PATENT DOCUMENTS

| | | |
|---|---|---|
| JP | 2001-274340 | 10/2001 |
| JP | 2002-270769 | 9/2002 |

OTHER PUBLICATIONS

U.S. Appl. No. 10/793,796, filed Mar. 8, 2004, Nakashima.

* cited by examiner

SEMICONDUCTOR DEVICE HAVING CAPACITOR FORMED IN MULTILAYER WIRING STRUCTURE

CROSS-REFERENCE TO RELATED APPLICATIONS

This application is based upon and claims the benefit of priority from the prior Japanese Patent Application No. 2002-218399, filed Jul. 26, 2002, the entire contents of which are incorporated herein by reference.

BACKGROUND OF THE INVENTION

1. Field of the Invention

The present invention relates to a semiconductor device, and in particular, to a semiconductor device having a capacitor formed in a multilayer wiring structure.

2. Description of the Related Art

Various semiconductor devices having a multilayer wiring structure are used. It is known that recent interconnection wiring used in the multilayer wiring structure of such a semiconductor device are composed of materials such as aluminum (Al) and copper (Cu). Different methods are used to form the interconnection wiring depending on whether or not these materials can be easily subjected to exposure, etching, or the like. In particular, if copper is used for the interconnection wiring, it has the advantages of offering smaller resistance than aluminum, hindering electromigration more excellently than aluminum, and the like. While, if copper is used for the interconnection wiring, it is known to be disadvantages in that it is diffused in silicon (Si) and silicon oxide ($SiO_2$) at a very high rate, in that it cannot be formed into a film properly using a CVD process, and in that it cannot be dry-etched.

Thus, a single damascene process or a dual damascene process is used to form the copper interconnection wiring, in order to be realized the advantages of the copper as used in the interconnection wiring, while effectively eliminating the disadvantages of copper as formed in the silicon (Si) and silicon oxide ($SiO_2$). In particular, using the dual damascene process, a via hole and a wiring groove portion connected to the via hole can be sequentially etched in an insulating film in a multilayer wiring layer. Subsequently, copper can be buried in the via hole and the wiring groove portion at the same time. The dual damascene process reduces the number of processes executed, thus enabling manufacturing costs to be reduced.

On the other hand, for capacitors used in analog circuits or the like, what is called a "MIM capacitor", composed of a metal film, a dielectric film, and a metal film, has been used in place of a polysilicon capacitor in order to improve capacitive accuracy. Description will be given below of an example of a conventional process of forming such a semiconductor device.

Such a semiconductor device has a multilayer wiring structure including, for example, a MOS transistor formed on a semiconductor substrate. The semiconductor device has a MIM capacitor formed in a predetermined wiring later in this multilayer wiring structure.

When a semiconductor device having such a structure is manufactured, first, a gate insulating film and a gate electrode of a MOS transistor are sequentially formed, by exposure and etching, on a semiconductor substrate between element isolation insulating films formed in the substrate. Then, an impurity ion injecting process is executed to form source/drain areas in the semiconductor substrate on the both sides of the gate insulating film and the gate electrode. Subsequently, a CVD process is used to form a first interlayer insulating film of $SiO_2$ covering the whole semiconductor substrate including the gate insulating film and the gate electrode. Then, the surface of the first interlayer insulating film is flattened using a CMP process.

Subsequently, the first interlayer insulating film located on one of the source/drain areas is etched so as to form a contact hole. Thus, a contact is formed which contacts with the top surface of the source/drain area. Furthermore, a second interlayer insulating film is deposited on the first interlayer insulating film. Then, a first wiring groove is etched in the second interlayer insulating film so as to connect to the contact. Copper is buried in the first wiring groove and then flattened using the CMP process, to form a first copper wiring. Then, a first copper diffusion stopper layer is deposited on the first copper wiring formed in the first interlayer insulating film.

Then, in an area of the semiconductor substrate different from that in which the MOS transistor has been formed, on the first copper diffusion stopper layer, a lower metal film (of a lower electrode), a dielectric film, an upper metal film (of an upper electrode), and a cap material film are sequentially deposited as a MIM capacitor.

Subsequently, the cap material film and the upper metal film are etched in order to form the upper electrode. Furthermore, the dielectric film and the lower metal film are etched in order to form the lower electrode. Then, a third interlayer insulating film is formed so as to cover all of the lower electrode, the dielectric film, the upper electrode, and the cap material film.

Subsequently, a wiring groove is formed in the third interlayer insulating film so as to connect to the upper electrode. Further, a via hole is formed in the third interlayer insulating film. The via hole leads to the lower electrode. A wiring groove is also formed which is connected to the via hole. In this case, a via hole and a wiring groove connected to the via hole may also be formed, as required, in the third interlayer insulating film formed on the area in which the MOS transistor is formed. Copper is deposited in these via holes and wiring grooves at the same time.

Subsequently, fourth and fifth wiring layers having similar configurations are formed on the third interlayer insulating film as required.

These steps complete a semiconductor device having a multilayer wiring structure in which a capacitor and copper wrings are formed in the wiring layers.

In the conventional manufacturing process for the conventional semiconductor device as described above, when a copper wiring is formed on the upper electrode of the MIM capacitor, the etching of the wiring groove may expose, undesirably, a part of the upper electrode or the etching may further proceed to expose even a part of the lower electrode. As a result, the copper wiring layer may undesirably be connected to the upper electrode or the lower electrode. Furthermore, even if the upper and lower electrodes are avoided to be exposed, if the wiring groove is etched down to the vicinity of either of these electrodes, then the copper wiring formed in this wiring groove may stress the electrodes, resulting in a crack thereof. As a result, the upper and lower electrodes may be short-circuited via the copper wiring to cause a leakage current. In other cases, a crack in the electrode may cause a defect in connections to degrade the functions of the MIM capacitor.

BRIEF SUMMARY OF THE INVENTION

According to one aspect of the present invention, there is provided a semiconductor device having a capacitor formed in a multilayer wiring structure, the semiconductor device comprising a plurality of wiring layers formed on a substrate, a capacitor arranged in one of the wiring layers and having a lower electrode, a dielectric film, and an upper electrode, a first via formed in the one wiring layer and connected to a top surface of at least the upper electrode of the capacitor, and a second via formed in an overlying wiring layer stacked on the one wiring layer so that the second via is formed on the first via.

According to another aspect of the present invention, there is provided a semiconductor device having a capacitor formed in a multilayer wiring structure, the semiconductor device comprising at least one impurity diffusion layer formed in a first area of a semiconductor substrate; a plurality of wiring layers stacked on the semiconductor substrate and including a first wiring layer having a contact connected to the impurity diffusion layer and a first wiring buried so as to connect to the contact; a capacitor formed in one of the plurality of wiring layers on a second area different from the first area of the semiconductor substrate, the capacitor having a stacked structure of a lower electrode, a dielectric film, and an upper electrode; a first via formed on at least the upper electrode in the one wiring layer; an upper wiring layer having an interlayer insulating film stacked on the one wiring layer, a second via formed in the interlayer insulating film to be connected to the first via, and formed to be thinner than the first via, and a second wiring connected to the second via and buried in a surface portion of the upper wired layer.

DETAILED DESCRIPTION OF THE INVENTION

Embodiments of the present invention will be described with reference to the drawings. The embodiments described below use copper wiring. However, the present invention is applicable to any wiring made of a material other than copper and formed of a conductive layer buried in a wiring groove formed in an interlayer insulating film.

First Embodiment

Figure 1:
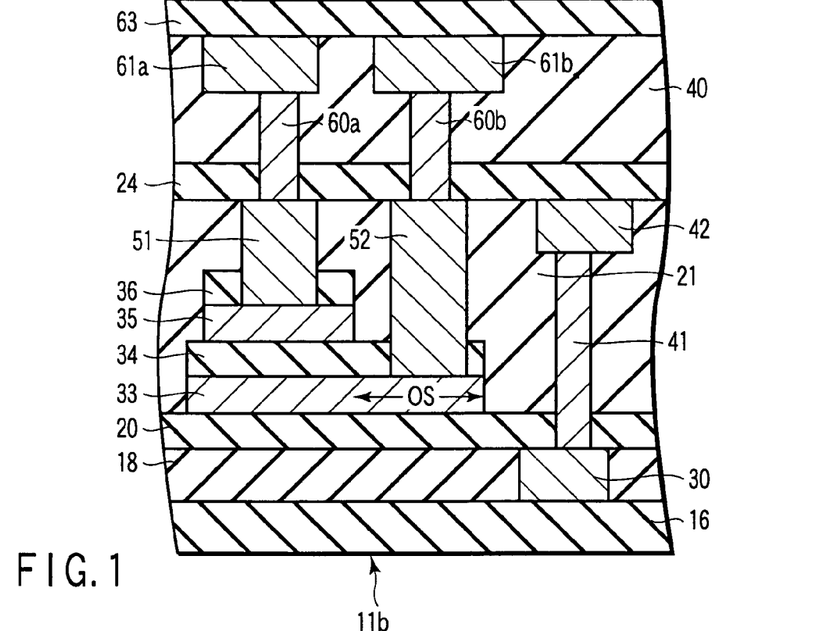
FIG. 1 is a sectional view showing the structure of a semiconductor device including a MIM capacitor formed in a wiring layer according to an embodiment of the present invention.

The sectional view in FIG. 1 shows a sectional structure according to the first embodiment of the present invention which structure has a MIM capacitor formed in a predetermined wiring layer, and vias and copper wiring formed in an overlying wiring layer formed above the MIM capacitor and connected to an upper and lower electrodes in the MIM capacitor. These predetermined wiring layer and overlying wiring layer form a part of a multilayer wiring structure formed on the semiconductor substrate shown in FIG. 2. With reference to the sectional view in FIG. 2 as well as FIG. 1, detailed description will be given of the structure of a semiconductor device according to the first embodiment of the present invention.

Figure 2:
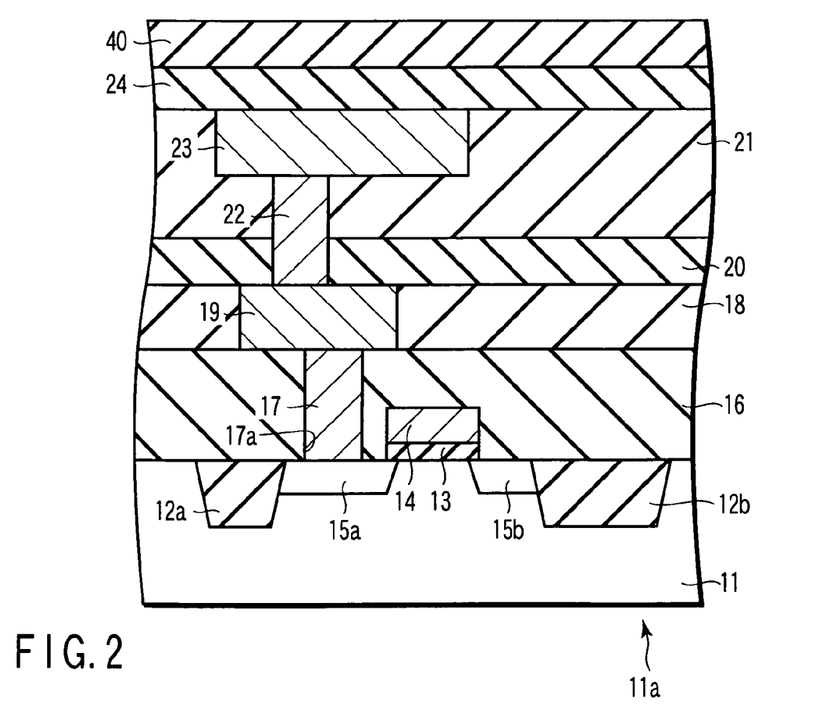
FIG. 2 is a sectional view of a multilayer wiring layer structure including a MOS type element formed in an area of the semiconductor substrate different from the area in which the MIM capacitor shown in FIG. 1 is formed.

First, in FIG. 2, two element isolation insulating films 12a and 12b are formed in a first area of a semiconductor substrate 11. A gate insulating film 13 made of $SiO_2$ or the like and a gate electrode 14 made of polysilicon or the like are sequentially formed on the semiconductor substrate 11 between the element isolation insulating films 12a and 12b. Further, two source/drain areas 15a and 15b are formed in surface regions of the semiconductor substrate 11 between both element isolation insulating films 12a and 12b and the gate insulating film 13.

A first interlayer insulating film 16 is formed all over a surface of the semiconductor substrate which contains a first area in which the gate insulating film 13 and the gate electrode 14 are formed and a second area which is different from the first area as will be described later.

A contact hole 17a is formed in the interlayer insulating film 16 so as to expose a top surface of the source/drain area 15a. Metal, for example, tungsten is deposited in the contact hole 17a to form a contact 17. The surfaces of the interlayer insulating film 16 and the contact 17 are flattened by the CMP process or the like.

A second interlayer insulating film 18 is formed on the first interlayer insulating film 16 and the contact 17. A wiring groove is formed in the second interlayer insulating film 18 to form a copper wiring 19 in the wiring groove so as to connect to the contact 17. A copper diffusion stopper film 20 is formed on the second interlayer insulating film 18 having the copper wiring 19 formed therein.

A third interlayer insulating film 21 is formed on the copper diffusion stopper film 20. A via 22 is formed through the interlayer insulating film 21 and diffusion stopper 20 so as to lead to the copper wiring 19. A copper wiring 23 is formed in a surface portion of the interlayer insulating film 21 and on the via 22.

A copper diffusion stopper film 24 is formed on a surface of the interlayer insulating film 21 and the copper wiring 23. Furthermore, an interlayer insulating film 40 is formed on the copper diffusion stopper film 24. Further, although not shown in the drawings, a via and a wiring may be formed in the interlayer insulating film 40 as required, with an overlying wiring layer formed on the interlayer insulating film 40.

Now, with reference to FIG. 1, description will be given of a multilayer wiring structure including an wiring layer having a capacitor formed in the second area on the semiconductor substrate 11 simultaneously with the multilayer wiring structure including the MOS transistor shown in FIG. 2.

The lowermost interlayer insulating film 16 shown in FIG. 1 is formed on the semiconductor substrate 11 simultaneously with the interlayer insulating film 16 shown in FIG. 2. In FIG. 1, the semiconductor substrate 11, arranged under the interlayer insulating film 16, is omitted. The interlayer insulating film 18, formed on the interlayer insulating film 16, is formed with a copper wiring 30 as well as the copper wiring 19 in FIG. 2. The copper diffusion stopper film 20 is also formed on the interlayer insulating film 18.

A MIM capacitor is formed on the copper diffusion stopper film 20 and is constructed by sequentially stacking, on the diffusion stopper film 20, a lower electrode 33 (metal film) made of, for example, TiN, a dielectric film 34 made of, for example, SiN or TaO, and an upper electrode 35 made of TiN or the like. Furthermore, an insulating film 36 made of, for example, SiN is formed on the upper electrode 35 as a cap material.

The interlayer insulating film 21 covers the whole stacked structure of the lower electrode 33, dielectric film 34, upper electrode 35, and insulating or cap material film 36. A via 41 is formed in the interlayer insulating film 21 as well as in the diffusion stopper film 20 so that a lower end of the via 41 is connected to the copper wiring 30. An upper end of the via 41 is connected to a copper wiring 42 formed on the via 41. Furthermore, a thick via 51 is formed on a top surface of the upper electrode 35. A thick via 52 is also formed on a top surface of the lower electrode 33.

In this case, the thick via 51 is set to have a diameter equal to or smaller than the maximum diameter size of the upper electrode 35 of the MIM capacitor in the cross section in FIG. 1. Actually, the diameter of the thick via 51 is set so that each side of it is located at a predetermined distance from a corresponding surface end of the upper electrode 35.

Likewise, the thick via 52 is formed to be as thick as possible so as to be located inside the tip of an offset portion OS of the lower electrode 33 which portion is projected rightward in the figure with respect to the upper electrode 35 and so that thick via 52 is insulated from a corresponding end of the upper electrode 35. In this case, if the vias 51 and 52 are set to have the same thickness, a mask can be easily formed which is used to form via holes for the vias 51 and 52.

Furthermore, the copper diffusion stopper film 24 is formed on the interlayer insulating film 21 in contact with vias 51 and 52 and the copper wiring 42 formed on the via 41. The interlayer insulating film 40 is further formed on the diffusion stopper film 24. Vias 60a and 60b are formed in the interlayer insulating film 40 such that the lower ends of the vias 60a and 60b pass through the copper diffusion stopper film 24 and are connected to the vias 51 and 52, respectively. The vias 60a and 60b are formed to be thinner than the vias 51 and 52 formed in the interlayer insulating film 21. For example, the vias 60a and 60b are set to be as thick as many vias formed in the semiconductor device, for example, the vias 22 and 41. Copper wiring lines 61a and 61b are formed on the vias 60a and 60b, respectively, in the interlayer insulating film 40. Although not shown in FIG. 2, a copper diffusion stopper film 63 is formed on the interlayer insulating film 40 in contact with top surfaces of the copper wiring lines 61a and 61b as shown in FIG. 1.

With reference to FIGS. 1 and 2, description has been given of the structure of the semiconductor device having the MIM capacitor in the multilayer wiring structure including the MOS transistor. With reference to FIGS. 3 to 7, detailed description will be given below of an example of a method of manufacturing a semiconductor device having the structure shown in FIGS. 1 and 2.

Figure 3:
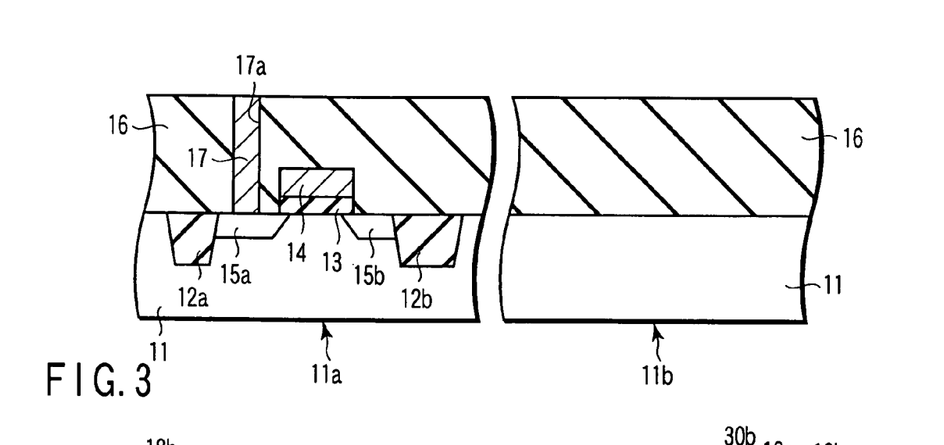
FIG. 3 is a sectional view showing a structure in an initial step of a manufacturing process for the semiconductor device shown in FIGS. 1 and 2.

In FIG. 3, the semiconductor substrate 11 has a second area 11b in which the MIM capacitor shown in FIG. 1 is formed, and a first area 11a in which the MOS transistor shown in FIG. 2 is formed. In this described embodiment, the MOS transistor and the MIM capacitor are formed in the different areas on the semiconductor substrate 11. However, the MIM capacitor may be formed above the MOS transistor in the same area on the semiconductor substrate 11.

First, in FIG. 3, predetermined portions in the surface of the substrate 11 are shallowly etched in the first area 11a. Insulator films are buried in the etched areas to form the element isolation insulating films 12a and 12b as STI (Shallow Trench Isolation). Subsequently, an oxide film used to form the gate oxide film 13 is formed all over the surface of the semiconductor substrate 11 including the surfaces of the element isolation insulating films 12a and 12b. For example, a polysilicon film used to form the gate electrode 14 is deposited all over the oxide film 13. A resist film (not shown) is deposited on the polysilicon film so as to form the gate electrode 14 using a photolithography process. A predetermined exposure mask is used to expose a pattern for forming the gate oxide film 13 and the gate electrode 14. This exposure pattern is used to carry out etching to form the gate oxide film 13 and the gate electrode 14 on the first area 11a of the semiconductor substrate 11 between the element isolation insulating films 12a and 12b.

Then, the source/drain areas 15a and 15b are formed in the semiconductor substrate 11 between both element isolation insulating films 12a and 12b and both gate oxide film 13 and gate electrode 14 by the impurity ion injection process. Subsequently, the first interlayer insulating film 16 is deposited all over the surface of the semiconductor substrate 11. The interlayer insulating film 16 is deposited by the CVD process and formed using as a material $SiO_2$ containing phosphorus or boron. FSG or other material may be used in place of $SiO_2$. Alternatively, a stacked structure of a plurality of materials may be used instead of the single-layer structure.

The surface of the first interlayer insulating film 16 is flattened by CMP. Furthermore, the photolithography process used to form the gate portion is executed to form the contact hole 17a in the first interlayer insulating film 16 so that the contact hole 17a leads to the source/drain area 15a. A contact material, for example, tungsten is buried in the contact hole 17a and then flattened by CMP to form the contact 17 connected to the top surface of the source/drain area 15a.

Figure 4:
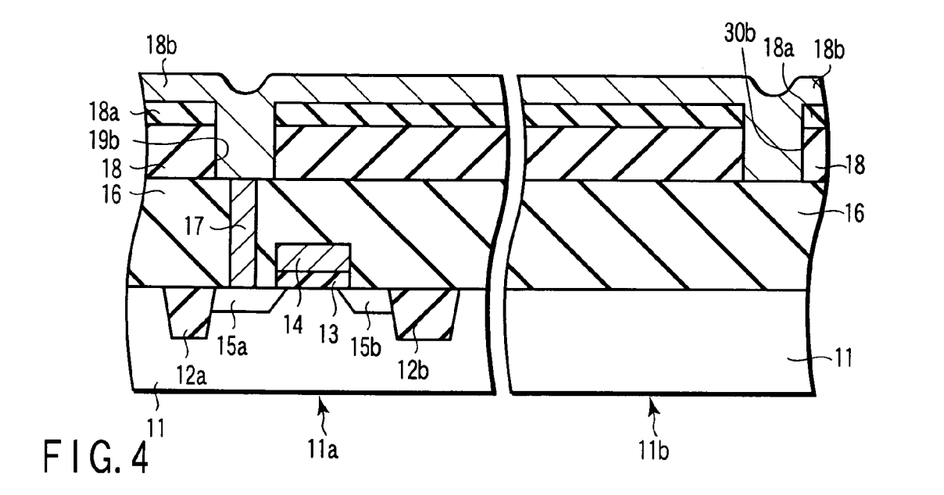
FIG. 4 is a sectional view showing the structure in a semiconductor device manufacturing step succeeding the step shown in FIG. 3.

Subsequently, as shown in FIG. 4, the second interlayer insulating film 18 is similarly formed on the first interlayer insulating film 16, and resist film 18a is deposited on the top surface of the interlayer insulating film 18. Then, the photolithography process is executed using the resist film 18a as an etching mask to form the wiring grooves 19b and 30b in the interlayer insulating film 18, in which the copper wiring portions 19 and 30, respectively, are to be formed.

Subsequently, copper is deposited all over the top surface of the device. Then, the CMP process is used to polish and flatten the top surface of the deposited copper film until the interlayer insulating film 18 is exposed.

Figure 5:
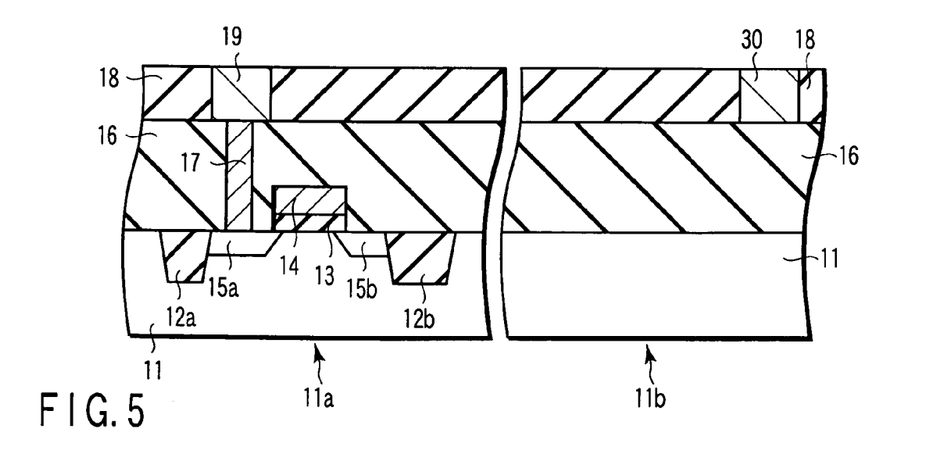
FIG. 5 is a sectional view showing the structure in a semiconductor device manufacturing step succeeding the step shown in FIG. 4.

As a result, as shown in FIG. 5, the copper wiring 19 is formed in the interlayer insulating film 18 in the first area 11a. The copper wiring 30 is formed in the interlayer insulating film 18 in the second area 11b.

Figure 6:
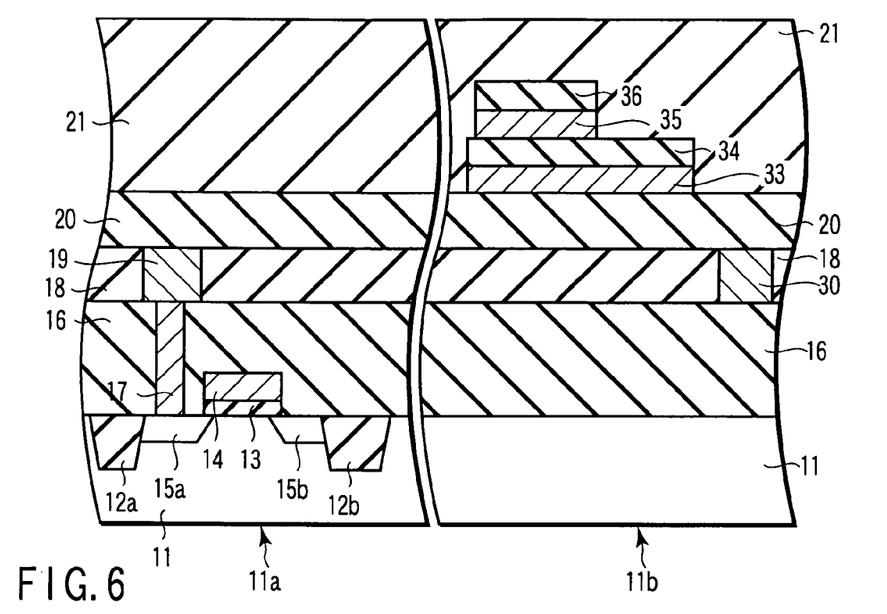
FIG. 6 is a sectional view showing the structure in a semiconductor device manufacturing step succeeding the step shown in FIG. 5.

Then, as shown in FIG. 6, the copper diffusion stopper film 20 is deposited on the copper wiring portions 19 and 30 and all over the first and second areas 11a and 11b. The copper diffusion stopper film 20 is formed of, for example, SiN. In this state, for example, TiN used to form the lower electrode 33 of the MIM capacitor is deposited on the copper diffusion stopper film 20 formed on the second area 11b. Subsequently, for example, SiN or TaO used for the dielectric film 34 is deposited, and then, for example, TiN constituting the upper electrode 35 is deposited. Finally, SiN is deposited which is used as the cap material film 36 when the via is formed on the upper electrode 35.

Subsequently, the lithography process is used to pattern the cap material film 36, the upper electrode 35, the dielectric film 34, and the lower electrode 33. First, a resist layer is deposited all over the SiN layer, which acts as the cap material film 36. Furthermore, a mask is placed on the resist layer and the resist layer is patterned in association with the cap material film 36 to form a resist mask. Then, the resist mask thus formed is used to etch the SiN film for the cap material film 36 and the TiN film for the upper electrode 35 to form simultaneously the cap material film 36 and the upper electrode 35.

Then, the upper electrode 35 and the cap material film 36 is covered by a resist film which is also deposited so as to cover the entire TiN film and SiN film, used to form the dielectric film 34 and lower electrode 33, respectively. Similarly, the lithography process is used to etch the dielectric film 34 and the lower electrode 33 into the illustrated pattern.

Subsequently, the interlayer insulating film 21 is formed on the copper diffusion stopper film 20 so as to cover the first area 11a and the MIM capacitor formed in the second area 11b.

Figure 7:
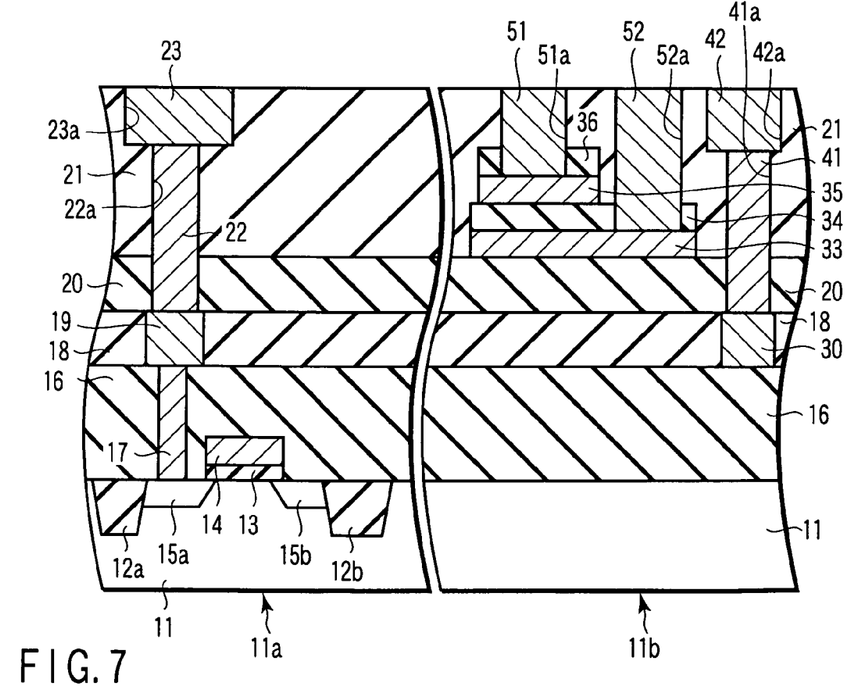
FIG. 7 is a sectional view showing the structure in a semiconductor device manufacturing step succeeding the step shown in FIG. 6.

In this case, as shown in FIG. 7, in the first area 11a, for example, a dual damascene process is used to form the via hole 22a on the copper wiring 19 and in the interlayer insulating film 21 via the copper diffusion stopper film 20. The wiring groove 23a is formed on the via hole 22a.

Further, in the second area 11b, for example, the dual damascene process is used to form the via holes 51a and 52a on the upper electrode 35 and the lower electrode 33. The via hole 41a is formed on the copper wiring 30 via the copper diffusion stopper film 20. The wiring groove 42a is formed on the via hole 41a.

Subsequently, copper is sequentially or simultaneously deposited in the via holes 22a, 51a, 52a, and 41a and wiring grooves 23a and 42a. The surface of the interlayer insulating film 21 is polished and flattened by the CMP process. The structure shown in FIG. 7 is thus formed.

Then, in the second area 11b, as shown in FIG. 1, the interlayer insulating film 40 is deposited, via the copper diffusion stopper film 24, on the interlayer insulating film 21 formed as described above. Subsequently, for example, the dual damascene process is used to form the vias 60a and 60b and the copper wiring portions 61a and 61b in the interlayer insulating film 40. On this occasion, the via 60a is formed to be thinner than the via 51, whereas the via 60b is formed to be thinner than the via 52. This will provide large margins for possible positional errors in the formation of the vias 60a and 60b with respect to the vias 51 and 52.

Subsequently, the surface of the interlayer insulating film 40 is flattened by the CMP process. Then, the copper diffusion stopper film 63 is formed. Although not shown, the diffusion stopper film 63 is also formed on the first area 11a in FIG. 2.

In the structure of the first embodiment as described above, the buried copper wiring 61a connected to the upper electrode 35 is not formed in the same wiring layer as is provided with the MIM capacitor composed of the upper electrode 35, the dielectric film 34, and the lower electrode 33. Consequently, when the wiring groove used to form the buried wiring is formed, etching does not reach the MIM capacitor. This prevents the buried wiring 61a and the upper electrode 35 from being short-circuited. Further, the via 51 is formed to be thicker than the via 60a, thus providing a large margin for a possible positional deviation between the vias 51 and 60a.

In the first embodiment, shown in FIG. 1, the copper wiring 61b, which is in contact with the lower electrode 33 of the MIM capacitor, is formed in the wiring layer formed in the interlayer insulating film 40, formed on the wiring layer formed in the interlayer insulating film 21, in which the lower electrode 33 is formed. However, the lower electrode 33 and the copper wiring in contact with the lower electrode 33 may be formed in the same wiring layer. In this configuration, the via 51 has a larger cross section than that of the via 60a. This enables large margins to be designed for possible errors such as deviation of mask alignment during manufacturing steps of the semiconductor device.

Second Embodiment

Figure 8:
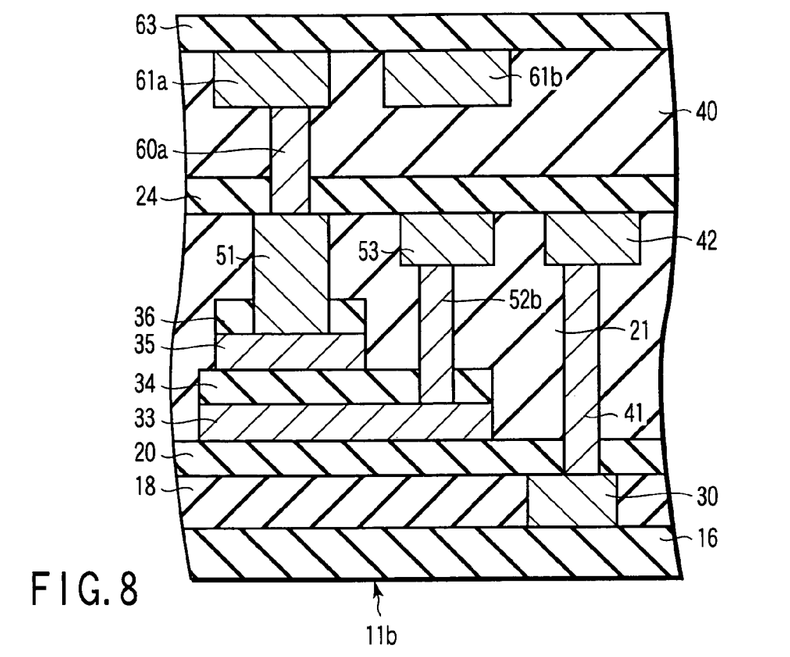
FIG. 8 is a sectional view of a multilayer wiring structure including a MIM capacitor of a semiconductor device according to another embodiment of the present invention.

FIG. 8 is a sectional view showing a second embodiment of the present invention in which the lower electrode 33 and the wiring connected to this lower electrode 33 are formed in the same interlayer insulating film 21 or in the same wiring layer. This figure shows a multilayer wiring structure including a MIM capacitor formed in the second area 11b of a semiconductor substrate (not shown) corresponding to that of the first embodiment in FIG. 1. In FIG. 8, the same elements as those of the first embodiment shown in FIG. 1 are denoted by the same reference numerals. Their detailed description is thus omitted.

In FIG. 8, the dual damascene process is used to form the via 52b connected to the lower electrode 33 and the copper wiring 53 located on the via 52b. Consequently, the copper wiring 61b is not connected to the lower electrode 33 unlike the embodiment shown in FIG. 1. The copper wiring 61b is formed in the wiring layer formed of the interlayer insulating film 40 above the wiring later in which the MIM capacitor is formed. In the second embodiment shown in FIG. 8, only the upper electrode 35 is connected through the thin via 60a to the copper wiring 61a formed in the wiring layer formed over the wiring layer in which the MIM capacitor is formed. When the interlayer insulating film 21 has a sufficient thickness between the lower electrode 33 of the MIM capacitor and the copper diffusion stopper film 24, then it is possible to form both via 52b and wiring 53 in the same interlayer insulating film 41 which contains the lower electrode 33.

In the structure of the second embodiment described above, as in the case with the first embodiment, the buried wiring 61a connected to the upper electrode 35 is not formed in the same wiring layer in which the MIM capacitor is formed, but formed in the wiring layer formed over the wiring layer containing the MIM capacitor. This prevents the wiring 61*a* and the upper electrode 35 from being short-circuited during the manufacturing process unlike the prior art. Further, the via 51 is formed to be thicker than the via 60*a*, thus providing a large margin for a possible positional deviation between the vias 51 and 60*a* being occurred during the manufacturing process.

Further, in both first and second embodiments, the copper wiring connected to the lower electrode 33 is arranged above this lower electrode 33. However, the copper wiring in contact with the lower electrode 33 may be arranged in the underlying wiring layer under the wiring layer in which the MIM capacitor having the lower electrode 33 is formed.

Third Embodiment

Figure 9:
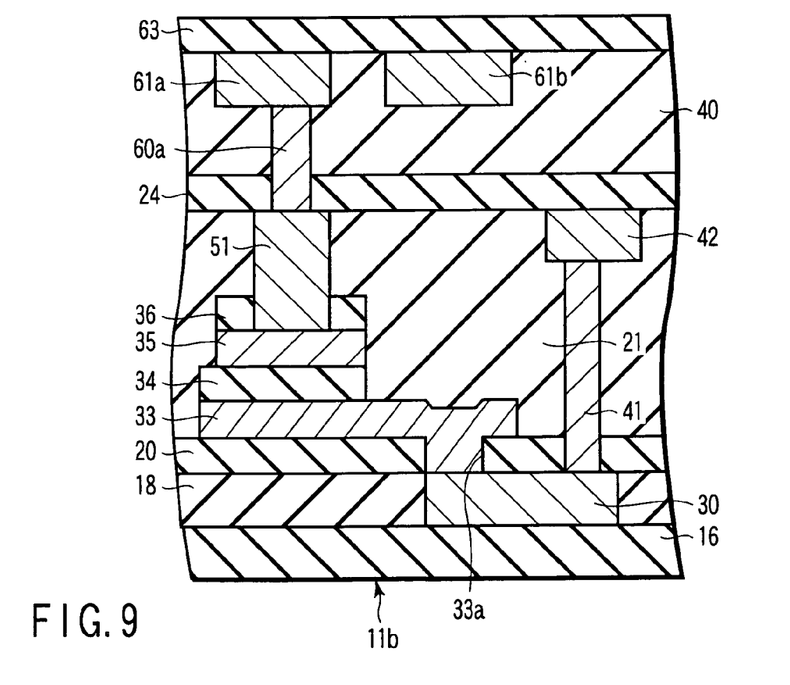
FIG. 9 is a sectional view of a multilayer wiring structure including a MIM capacitor of a semiconductor device according to yet another embodiment of the present invention.

FIG. 9 is a sectional view of a third embodiment showing an example of this configuration. This figure is a sectional view in which the wiring in contact with the lower electrode 33 is arranged in the wiring layer immediately below the wiring layer in which the lower electrode 33 or the MIM capacitor is formed. It also shows the structure of a multilayer wiring structure including the MIM capacitor formed in the second area 11*b* of a semiconductor substrate (not shown) as in the case with FIGS. 1 and 8. In FIG. 9, the same elements as those of the first or second embodiment are denoted by the same reference numerals. Their detailed description is thus omitted.

In FIG. 9, the copper wiring 30 having an extended portion reaching at the under position of the lower electrode 33 which is being formed later is formed in the interlayer insulating film 18. Subsequently, the copper diffusion stopper film 20 immediately above the copper wiring 30 is etched to form a hole 33*a* from which a part of the copper wiring 30 is exposed. Accordingly, when an electrode material used to form the lower electrode 33 is formed on the copper diffusion stopper film 20, the lower electrode 33 is connected to the copper wiring 30 via the hole 33*a*.

After the MIM capacitor has been formed in the similar manner as in the case of the first and second embodiments, the via 51, the via 41 connected to the copper wiring 31, and the copper wiring 42 connected to the via 41 are simultaneously formed in the interlayer insulator film 21 using, for example, the dual damascene process. Accordingly, the third embodiment shown in FIG. 9 does not use the via 52*b* or copper wiring 53 connected to the lower electrode 33 shown in the second embodiment of FIG. 8. The other arrangements of the third embodiment shown in FIG. 9 are the same as those of the embodiment shown in FIG. 8.

Even in the structure of the third embodiment, the buried wiring 61*a* is not formed in the same wiring layer in which the MIM capacitor is formed. This prevents the wiring 61*a* and the upper electrode 35 from being short-circuited. Further, the via 51 is formed to be thicker than the via 60*a*, thus providing a large margin for a possible positional deviation between the vias 51 and 60*a*.

According to the configuration of the third embodiment of FIG. 8, the lower electrode 33 is connected to the copper wiring 30, located under the lower electrode 33, and then the copper wiring 30 is connected to the copper wiring 42 through the via 41 in the interlayer insulating film 21 containing the MIM capacitor. This is effective when it is impossible to form a via or both via and copper wiring on the lower electrode for any reason related to the process, configuration, or the like.

As described above in detail, the present invention prevents a capacitor such as a MIM capacitor and a metal wiring from being short-circuited owing to over etching for forming the wiring groove to connect the upper electrode of the MIM capacitor formed in a multilayer wiring structure to the metal wiring. Further, when a via connected to the wiring is formed on the capacitor electrode, over etching defects of the via hole at the capacitor electrode can be prevented. Therefore, a reliable semiconductor device having a capacitor formed in a multilayer wiring structure can be provided.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device, comprising:
   a multilayer wiring structure including a plurality of wiring layers formed on a substrate;
   a capacitor arranged in a predetermined wiring layer in the multilayer wiring structure and including a lower electrode, a dielectric film, and an upper electrode;
   a first via formed in the predetermined wiring layer and connected directly to a top surface of the upper electrode of the capacitor; and
   a second via formed in an overlying wiring layer stacked on the predetermined wiring layer, the second via being connected directly on the first via and the second via being connected to a wiring formed in the overlying wiring layer,
   wherein the first via is formed to have a larger cross section than that of the second via.

2. A semiconductor device according to claim 1, wherein the predetermined wiring layer has a third via formed on the lower electrode and a wiring connected to the third via and buried in a surface of the predetermined wiring layer.

3. A semiconductor device according to claim 2, wherein the wiring comprises copper, and a copper diffusion stopper film is formed on the surface of the predetermined wiring layer to prevent diffusion of the copper forming the wiring.

4. A semiconductor device according to claim 1, wherein the overlying wiring layer has a wiring connected to a top of the second via and buried in a surface of the overlying wiring layer.

5. A semiconductor device according to claim 1, wherein a third via formed above the lower electrode of the capacitor is provided in the predetermined wiring layer;
   a fourth via connected on the third via and formed to be thinner than the third via is provided in the overlying wiring layer; and
   the second and fourth vias are connected to the first and second wirings, respectively, buried in a surface of the overlying wiring layer.

6. A semiconductor device according to claim 1, wherein the lower electrode of the capacitor is connected to a wiring buried in a surface of an underlying wiring layer formed under the predetermined wiring layer in which the capacitor is formed.

7. A semiconductor device comprising:
   a multilayer wiring structure including a plurality of wiring layers formed on a substrate;
   a capacitor arranged in a predetermined wiring layer in the multilayer wiring structure and including a lower electrode, a dielectric film, and an upper electrode;

a first via formed in the predetermined wiring layer and connected directly to a top surface of the upper electrode of the capacitor; and a second via formed in an overlying wiring layer stacked on the predetermined wiring layer, the second via being connected directly on the first via and the second via being connected to a wiring formed in the overlying wiring layer, wherein a third via formed on the lower electrode of the capacitor is provided in the predetermined wiring layer; a fourth via formed connected to a top of the third via and formed to be thinner than the third via is provided in the overlying wired layer; and the second and fourth vias are connected to the first and second wirings, respectively, buried in a surface of the overlying wiring layer.

8. A semiconductor device, comprising:

at least one impurity diffusion layer formed in a first area of a semiconductor substrate;

a plurality of wiring layers stacked on the semiconductor substrate and including a first wiring layer having a contact connected to the impurity diffusion layer and a first wiring buried in the first wiring layer and connected to the contact;

a capacitor formed in a predetermined one of the plurality of wiring layers which predetermined wiring layer is formed on a second area different from the first area of the semiconductor substrate, the capacitor having a stacked structure of a lower electrode, a dielectric film, and an upper electrode;

a first via connected directly on at least the upper electrode formed in the predetermined wiring layer;

an upper wiring layer having an interlayer insulating film stacked on the predetermined wiring layer, a second via formed in the interlayer insulating film, connected directly to the first via, and formed to be thinner than the first via, and a second wiring connected directly to the second via and buried in a surface portion of the upper wiring layer.

* * * * *